(12) United States Patent
Fan et al.

(10) Patent No.: US 7,241,950 B2
(45) Date of Patent: Jul. 10, 2007

(54) SOLAR CELL ELECTROLYSIS OF WATER TO MAKE HYDROGEN AND OXYGEN

(75) Inventors: Qinbai Fan, Chicago, IL (US); Michael Onischak, St. Charles, IL (US); William E. Liss, Libertyville, IL (US)

(73) Assignee: Gas Technology Institute, Des Plaines, IL (US)

( * ) Notice: Subject to any disclaimer, the term of this patent is extended or adjusted under 35 U.S.C. 154(b) by 560 days.

(21) Appl. No.: 10/791,958

(22) Filed: Mar. 3, 2004

(65) Prior Publication Data

US 2005/0194041 A1    Sep. 8, 2005

(51) Int. Cl.
*H01L 31/048* (2006.01)
(52) U.S. Cl. ............... 136/256; 136/244; 136/252; 136/291; 204/242; 204/247
(58) Field of Classification Search ............... 136/244, 136/252, 256, 291; 204/242, 247
See application file for complete search history.

(56) References Cited

U.S. PATENT DOCUMENTS

| | | | |
|---|---|---|---|
| 4,181,593 A | 1/1980 | McKinzie et al. | |
| 4,215,155 A | 7/1980 | McKinzie et al. | |
| 6,936,143 B1 * | 8/2005 | Graetzel et al. | 204/242 |
| 2004/0003837 A1 * | 1/2004 | Mauk | 136/244 |
| 2005/0211290 A1 * | 9/2005 | Deng et al. | 136/252 |

OTHER PUBLICATIONS

Varner, Ken, "Evaluation of Amorphous Silicon as a Direct Water Splitting System", National Renewable Energy Laboratory, Golden, Colorado, Aug. 2, 2002.

* cited by examiner

*Primary Examiner*—Nam Nguyen
*Assistant Examiner*—Anthony Fick
(74) *Attorney, Agent, or Firm*—Mark E. Fejer

(57) ABSTRACT

A water permeable electrode for electrochemical splitting of water having a light sensitive catalytic material layer which includes a light sensitive catalytic material and a semiconductor, a polymer electrolyte membrane layer, a metallic substrate layer disposed there between adjacent the polymer electrolyte membrane layer, and at least one photovoltaic device connected in series to the light sensitive catalytic material layer and disposed between the light sensitive catalytic material layer and the metallic substrate layer.

28 Claims, 6 Drawing Sheets

Prior Art

SOLAR CELL ELECTROLYSIS OF WATER TO MAKE HYDROGEN AND OXYGEN

BACKGROUND OF THE INVENTION

1. Field of the Invention

This invention relates to an apparatus for producing hydrogen directly from solar energy. More particularly, this invention relates to direct photoelectrolysis of water to generate hydrogen directly with sunlight employing a combination of advances in fuel cell technology, photovoltaic technology, photoelectrochemistry, and thin film technology.

2. Description of Related Art

Solar hydrogen generation represents an important long-term objective for the energy industry. Hydrogen is an important future energy carrier and energy storage medium. Efficient, low-cost methods of making hydrogen from renewable solar energy are an important element of the future hydrogen economy. With clean and abundant solar energy, solar photovoltaic, photoelectrochemical, or photocatalytic hydrogen generation could become viable technologies. However, to make this a reality, it is necessary to reduce costs, increase efficiency, and improve service life.

For current solar photovoltaic cell-driven electrolysis, the overall efficiency is the product of the efficiency of the solar cell and the efficiency of the electrolyzer. Solar cell efficiencies have been reported from 6% to as high as 32% with different materials. Current electrolyzer efficiency is approximately 75%. Hence solar cell-driven electrolysis efficiency could be from 4.5 to 24%, while in practice values at the low end of this range are encountered. These low efficiencies are in part due to efficiency losses from sunlight absorption by a liquid electrolyte layer, impediments to the departure of product gases from the photoelectrodes due to electrolyte surface tension, and high overpotential of the photoelectrodes. In addition, system life is limited by photocorrosion and electrochemical corrosion of the electrode. Further, the costs of all these devices are too high for wide use.

The current design of photoelectrodes is an additional hindrance to the development of improved photoelectrochemical systems because the semiconductors employed therein are fabricated on conductive substrates. With this type of design, there is no way to reduce the thickness of the electrolyte layer and eliminate the surface tension that acts as an inhibitor to the release of product gases because the reactant water and electrolyte must be transported to the front of the electrode.

Numerous efforts have been made to enhance the efficiency and stability of photoelectrochemical cells. The general approach has been to coat a layer of protective materials, which may be organic substances, active metal ions, noble metals, light sensitive dyes and more stable semiconductors, such as metal oxides, onto the photoelectrode surface. Recent developments include a thin film dye to sensitize the semiconductor electrodes in photoelectrochemical cells. Although the use of light sensitive dyes on the semiconductor electrode surface has improved the light absorption efficiency thereof, it is still necessary that the mass transport rate be increased and that the electrolyte thickness be reduced.

SUMMARY OF THE INVENTION

It is, thus, one object of this invention to provide an apparatus for direct splitting of water to produce hydrogen having improved efficiency over conventional photoelectrolytic systems for hydrogen generation.

It is another object of this invention to provide an apparatus for direct splitting of water to produce hydrogen having improved durability over conventional photoelectrolytic systems for hydrogen generation.

It is yet a further object of this invention to provide an apparatus for direct splitting of water to produce hydrogen in which semiconductor corrosion during operation of the apparatus is reduced compared to conventional photoelectrolytic systems for hydrogen generation.

It is yet a further object of this invention to provide an apparatus for direct splitting of water to generate hydrogen which enables the transmission of sunlight to the photoelectrode catalyst surface without incurring the energy losses incurred in conventional photoelectrolytic systems.

It is another object of this invention to provide an apparatus for direct splitting of water to generate hydrogen which eliminates the water surface tension responsible for hindering the escape of the hydrogen and oxygen gases from the catalyst surface encountered in conventional photoelectrolytic systems.

These and other objects of this invention are addressed by an electrode for electrochemical splitting of water comprising a light sensitive catalytic material layer, a polymer electrolyte membrane layer, a metallic substrate layer disposed there between directly adjacent to the polymer electrolyte membrane layer, and at least one photovoltaic device connected in series to the light sensitive catalytic material layer and disposed between the light sensitive catalytic material layer and the metallic substrate layer. Each of the light sensitive catalytic material layer, the polymer electrolyte membrane layer, the metallic substrate layer and the at least one photovoltaic device is water permeable. Water from an electrolyte employed in the water-splitting apparatus of this invention permeates through the photoelectrode from the polymer electrolyte membrane layer to the light sensitive catalytic material layer at the surface, forming a three-phase zone, i.e., semi-conductor with electrochemical catalyst, water and product gases (hydrogen and oxygen). This helps to avoid corrosion of the important semiconductor photoelectrodes while also permitting maximum direct solar irradiance. The hydrogen thus generated is then removed from the housing for use or further processing as necessary.

At least one, and preferably two or more, such photoelectrodes are disposed in an enclosure or housing having at least one light transmissive wall. The photoelectrodes are arranged such that the light sensitive catalytic material layer is oriented in the direction of, and disposed at a distance from, the at least one light transmissive wall. A water-based electrolyte is disposed on the side of the photoelectrode on which is disposed the polymer electrolyte membrane layer and is precluded from coming between the light sensitive catalytic material layer and the at least one light transmissive wall. In this manner, sunlight striking the at least one light transmissive wall passes through the wall and directly strikes the light sensitive catalytic material layer of the photoelectrode without passing through an electrolyte layer. This reduces irradiance losses due to absorption or reflective scatter of sunlight striking or passing through an electrolyte layer as occurs in conventional systems.

BRIEF DESCRIPTION OF THE DRAWINGS

These and other objects and features of this invention will be better understood from the following detailed description taken in conjunction with the drawings wherein.

DETAILED DESCRIPTION OF THE PRESENTLY PREFERRED EMBODIMENTS

Figure 1:
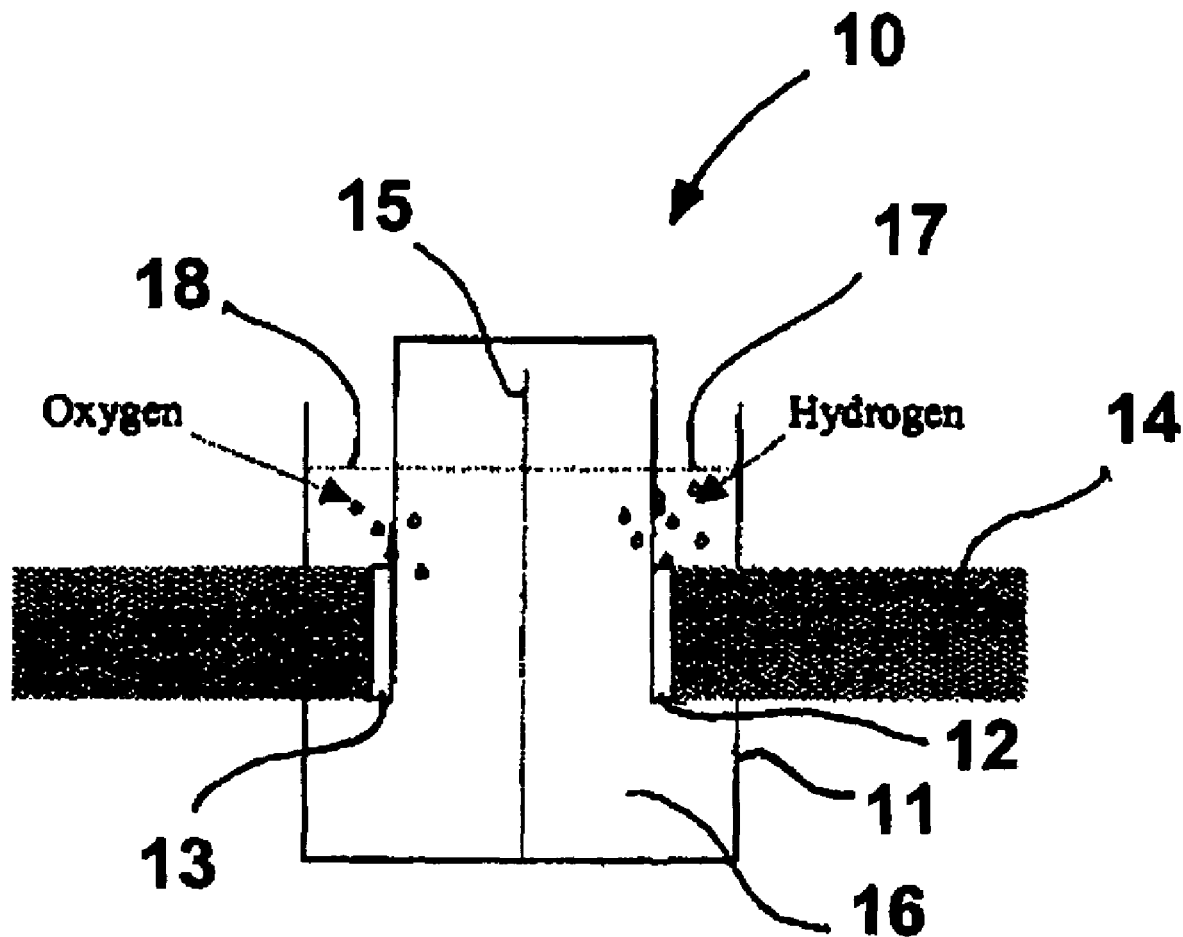
FIG. 1 is a schematic diagram of a conventional photo-electrolysis cell for water splitting.

FIG. 1 is a diagram showing a conventional water-splitting photoelectrochemical cell 10, which cell comprises a transparent housing or enclosure 11 filled with an electrolyte (e.g. water and $H_2SO_4$) 16, a semiconductor photoanode 13 and a semiconductor photocathode 12, both of which comprise a light sensitive catalytic material, disposed within and surrounded by the electrolyte and a separator 15 also disposed within the electrolyte separating the semiconductor photoanode 13 from the semiconductor photocathode 12. The hydrogen half-cell reaction for this cell is:

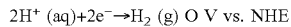
$2H^+ (aq) + 2e^- \rightarrow H_2 (g)$ 0 V vs. NHE and the oxygen half-cell reaction is:

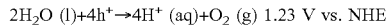
$2H_2O (l) + 4h^+ \rightarrow 4H^+ (aq) + O_2 (g)$ 1.23 V vs. NHE

Thus, the total reaction is:

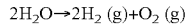
$2H_2O \rightarrow 2H_2 (g) + O_2 (g)$

Therefore, in the whole reaction, there is no loss of a proton.

As can be seen in FIG. 1, conventional photoelectrochemical cells, also sometimes referred to herein as photoelectrolysis cells, have a thick layer 17, 18 of liquid electrolyte (e.g. a water/acid solution) disposed between the light transmissive walls defining a light transmissive enclosure 11 and the photoelectrode 12, 13, through which the sunlight 14 must pass to get to the photoelectrodes. As a result, a substantial amount of solar energy is lost as the sunlight passes through the liquid electrolyte to the photoelectrode. In addition, contact between the photoelectrodes and the acidic electrolyte causes corrosion of the photoelectrodes. To increase the catalyst efficiency and the solar energy efficiency, the electrolyte thickness in the photoelectrochemical cell should be reduced to as thin as possible so as to reduce the solar energy absorption by the electrolyte. To reduce photoelectrode corrosion, contact of the photoelectrodes by the acidic electrolyte should be avoided.

Figure 2:
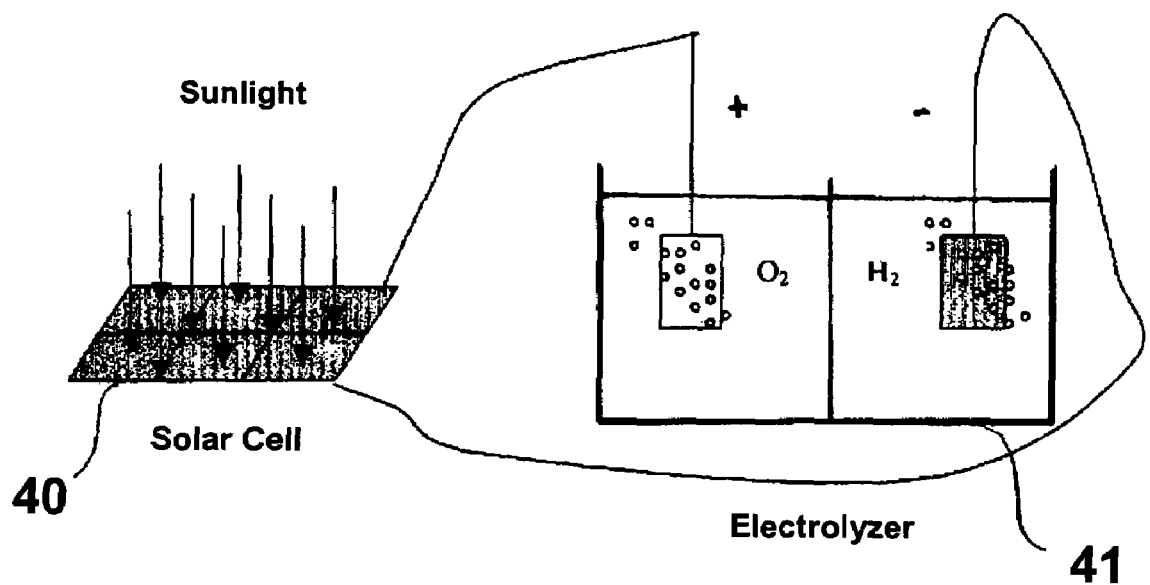
FIG. 2 is a schematic diagram of a conventional solar powered hydrogen generator.

FIG. 2 shows a conventional solar powered system for generating hydrogen comprising one or more solar cells 40 operably connected to an electrolyzer 41. As shown, the solar cells 40 produce electricity, which is used to split water to make hydrogen and oxygen. However, the device has low efficiency due to ohmic losses and the power density is low due to limitations in space.

With conventional photocatalysts, the voltage generated by conventional photovoltaic or solar cells is not sufficient to split water. Theoretically, 1.23 volts are required to decompose or split water into hydrogen and oxygen; however, because of electrode overpotential, a voltage of about 1.6 volts is actually required. In the invention disclosed and claimed herein, this issue is addressed by connecting two or more cells in series to attain more than 1.6 volts. Normally, a solar cell is fabricated as a p-i-n semiconductor structure. In accordance with one embodiment of this invention, two solar cells are connected in series as m-p-i-n/water/p-i-n-m, where m is a perforated metal substrate and i is an intrinsic layer. In order to decrease the electrode potential, catalyst powders are deposited on an n-type or p-type semiconductor. The catalyst powders have two primary functions, 1) reducing electrode overpotential, thereby increasing hydrogen and oxygen evolution efficiency and 2) reducing semiconductor corrosion caused by high electrode potential and acidic solutions.

Figure 3:
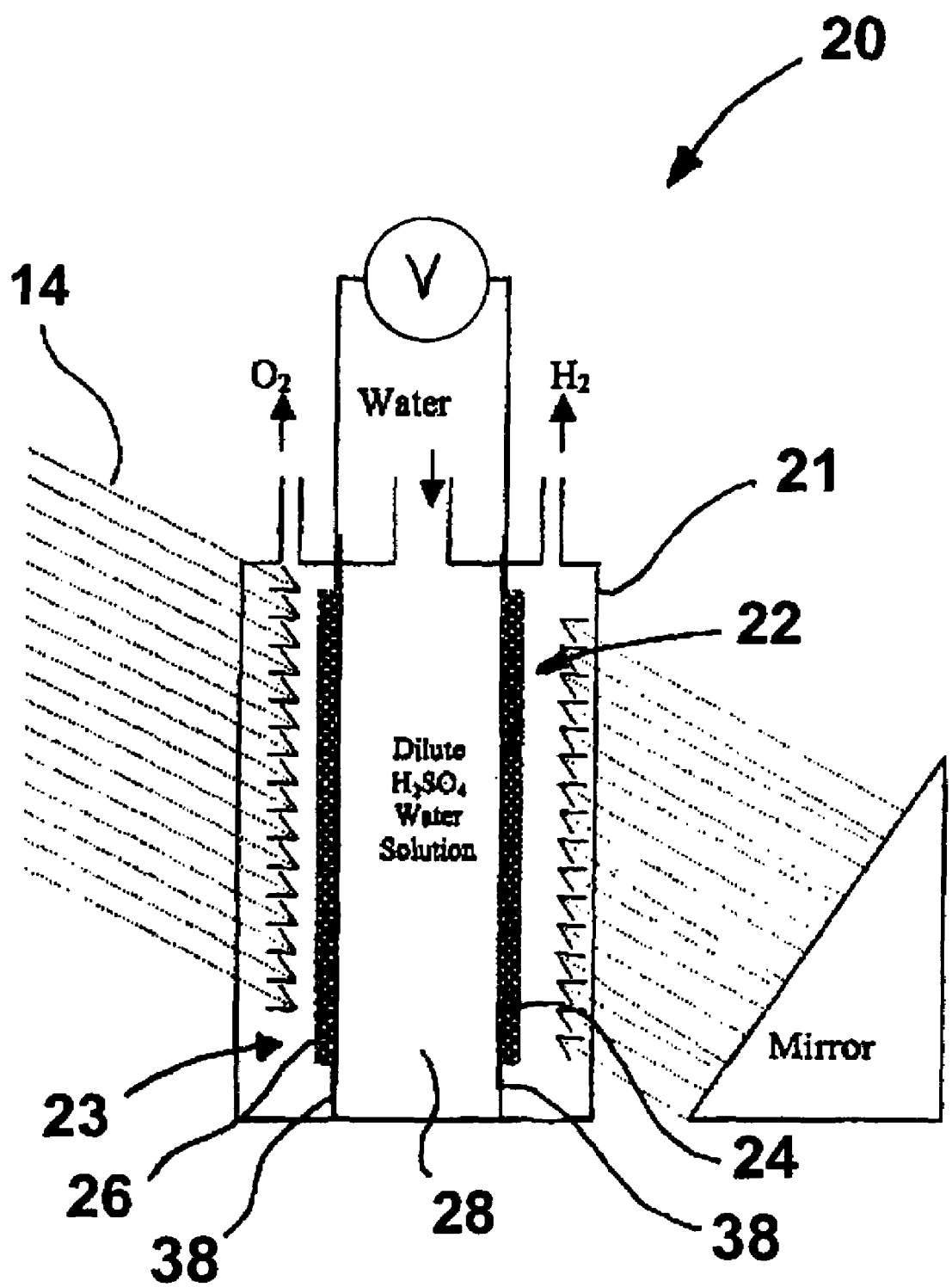
FIG. 3 is a schematic diagram of a photovoltaic cell for hydrogen generation in accordance with one embodiment of this invention.

FIG. 3 shows a solar powered electrolytic cell 20 in accordance with one embodiment of this invention, which cell comprises a light transmissive enclosure 21, preferably constructed of glass or plexiglas, photoelectrodes 22, 23 and an electrolyte 28 in the form of a dilute $H_2SO_4$ water solution disposed between photoelectrodes 22, 23. Photoelectrodes 22, 23 comprise a polymer electrolyte membrane layer 38 in contact with the electrolyte and a plurality of semiconductor layers, generally designated as reference numerals 24, 26 disposed on a surface of polymer electrolyte membrane 38 facing away from electrolyte 28 and in a direction of a light transmissive wall of light transmissive enclosure 21. As will be appreciated from consideration of FIG. 3, there is no electrolyte in the space between photoelectrodes 22, 23 and the light transmissive walls of light transmissive enclosure 21. As a result, the only solar loss encountered by sunlight 14 as it shines on the photoelectrodes is due to the light transmissive walls of the light transmissive enclosure 21.

Photoelectrodes 22, 23 are comprised of water permeable components, thereby enabling water from the electrolyte 28 to arrive at the 3-phase zone, i.e. semiconductor catalyst, water and product gas, at the surface of the photoelectrodes directly facing the light transmissive wall(s) of the light transmissive enclosure 21. In operation, the electrolyte water is distributed from the side of the photoelectrodes 22, 23 facing the electrolyte 28 and transported through the photoelectrode component layers to the catalyst layer. The products from the photoelectrolysis, hydrogen and oxygen, can, thus, leave the surfaces of the photoelectrodes without any restrictions from liquid water and corrosion of the photoelectrodes by the acidic components of the electrolyte is avoided. Proton transfer between the photoelectrodes is effected by the polymer electrolyte membrane layers comprising proton exchange membranes. Thus, the polymer electrolyte membrane layers 25, 27 function as gas separators, water containers, proton exchangers, and water transporters. Because the polymer electrolyte membrane layers prevent direct contact between the acidic portion of the electrolyte and the photoelectrodes, corrosion of the photoelectrodes is significantly reduced compared to conventional photoelectrolysis cells. Suitable polymer electrolyte membranes for use in the photoelectrodes of this invention include perfluorosulfonate ionomers, such as NAFION, available from DuPont Chemical Company, and polyimide.

Figure 4:
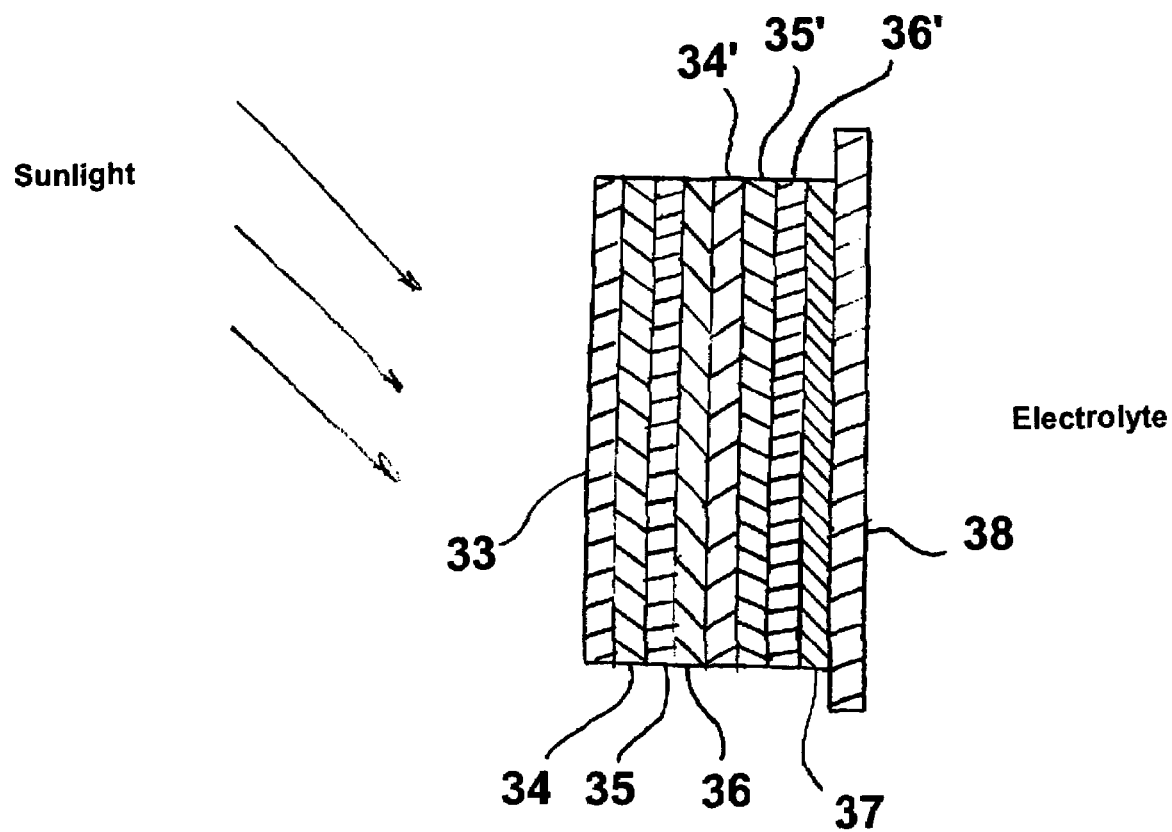
FIG. 4 is a cross-sectional view of a photoelectrode in accordance with one embodiment of this invention.
Figure 5:
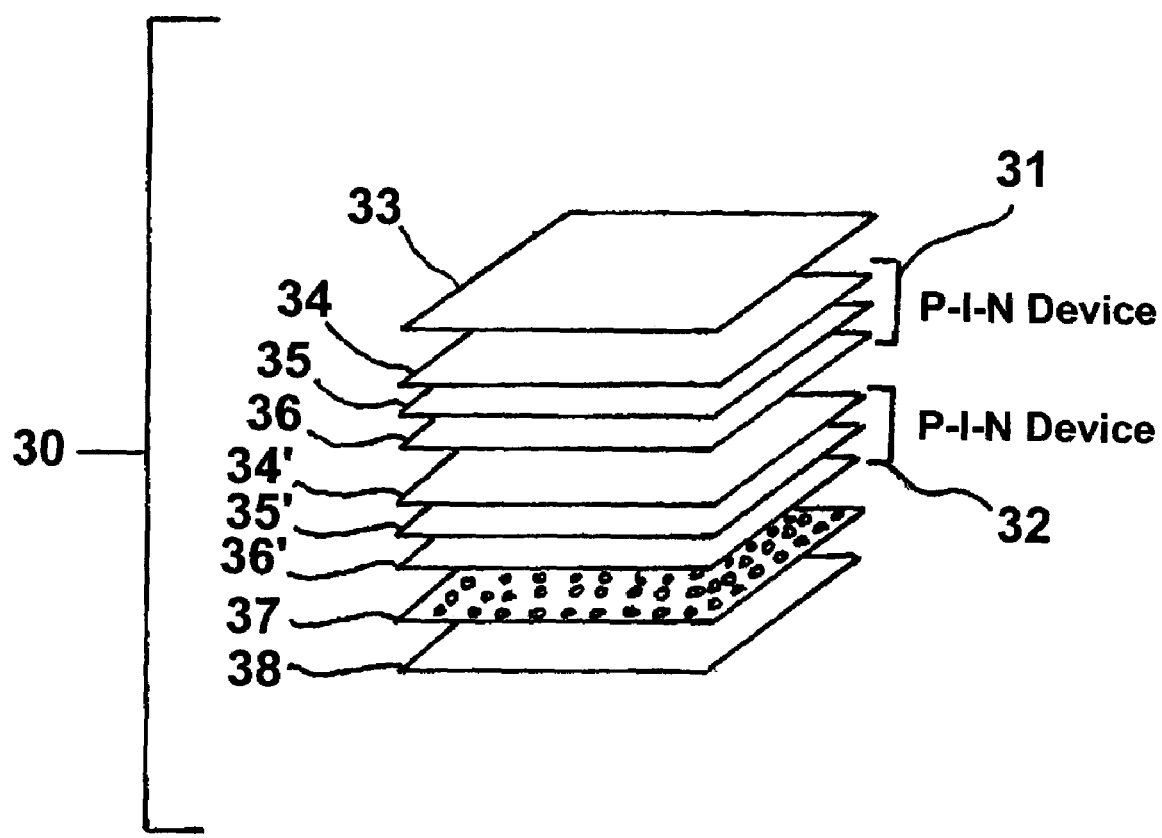
FIG. 5 is an exploded view of a photoelectrode in accordance with one embodiment of this invention.

Photoelectrodes 22, 23 shown in cross-section in FIG. 4 and in an exploded view in FIG. 5, as previously indicated, comprise a polymer electrolyte membrane layer 38 in contact with the electrolyte 28 when the photoelectrodes are in use. In addition to polymer electrolyte membrane layer 38, photoelectrodes 22, 23 comprise a metallic substrate layer 37 disposed on the surface of the polymer electrolyte membrane layer 38 facing away from electrolyte 28 and in the direction of a light transmissive wall of light transmissive enclosure 21. In addition to providing support for the photoelectrodes, metallic substrate layer 37 may also be used as a current collector.

Disposed on the surface of metallic substrate layer 37 facing away from the electrolyte 28 is at least one solar cell 31, also sometimes referred to herein as a photovoltaic cell, which is connected in series to light sensitive catalytic layer 33 disposed on the side of solar cell 31 facing in the direction of the light transmissive wall of light transmissive enclosure 21. The light sensitive catalytic layer 33 comprises a light sensitive catalytic material, which is preferably selected from the group consisting of Pt, Ni, Fe, Ti, light sensitive dyes and combinations thereof and one of a p-type and an n-type semiconductor. In accordance with one particularly preferred embodiment of this invention, the photoelectrodes 22, 23 comprise a plurality of solar cells or photovoltaic cells, i.e. p-i-n devices 31, 32 as shown in FIGS. 4 and 5, which are connected in series to each other and to light sensitive catalytic layer 33. Each solar cell 31, 32 comprises a p-type semiconductor 34, 34', an n-type semiconductor 36, 36' and an insulator layer 35, 35' interposed between the p-type semiconductor and the n-type semiconductor layers.

To be suitable for use as a water-splitting photoelectrode, the semiconductor employed in the light sensitive catalytic layer 33 must have the appropriate band gap, electronic energies and chemical stability. Wide band gap semiconductors, such as $TiO_2$, have the appropriate band edge energies for water splitting and have good photoelectrochemical stability. Under illumination, the absorption of light by a semiconductor results in the promotion of an electron from a lower occupied energy band (the valence band) into a higher unoccupied energy level (the conduction band). The valence band forms a hole after the electron leaves. The electron-hole pair can recombine after it reacts with the electrolyte, resulting in the conversion of the light energy to chemical energy.

The semiconductor material utilized in the apparatus of this invention may be $TiO_2$ with a different doping to be either n- or p-type. In accordance with one preferred embodiment of this invention, the semiconductor material is mixed with 20% by weight NAFION and 10% by weight carbon black to form a slurry. This slurry is applied to a NAFION proton exchange membrane by one of several coating techniques. The key requirement is that a three-phase contact area is formed in the photoelectrolysis cell as previously discussed. On the photosensitive semiconductor surface, the reactant, i.e. liquid water is needed and the product gas is hydrogen. If the liquid water layer is too thick, as is the case with conventional systems, it is more difficult for the hydrogen gas to leave the catalyst surface. A good three-phase area provides easy transport of the liquid water to the catalyst surface and easy departing of the product gas from the catalyst surface. It is also important that the water layer be as thin as possible to reduce the absorption of the light.

Figure 6:
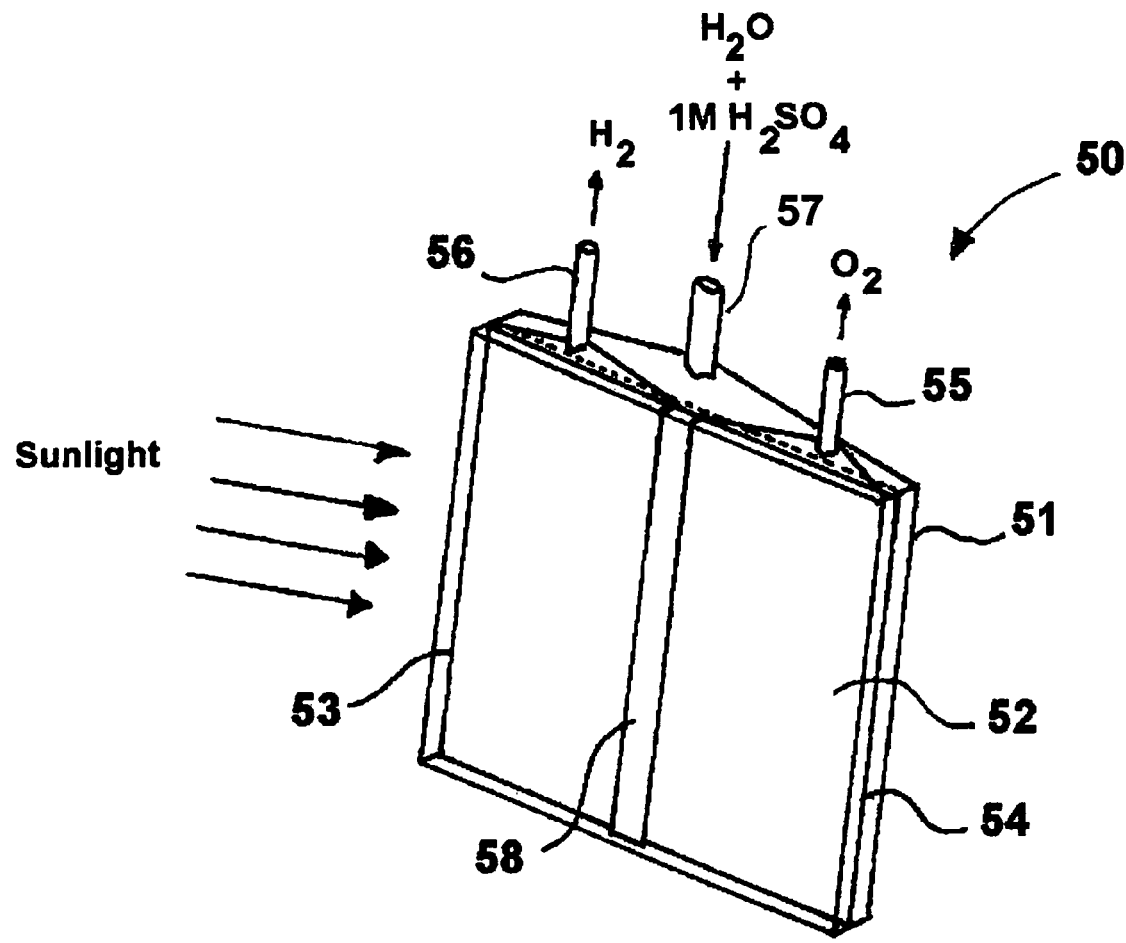
FIG. 6 is a schematic diagram showing a dual flat-face half-cell where the hydrogen generation and oxygen evolution occur side-by-side on a flat surface in accordance with one embodiment of this invention.

FIG. 6 is a diagram showing a dual flat-face half-cell 50 in accordance with one embodiment of this invention where the hydrogen generation and oxygen evolution occur side-by-side on a flat surface. The apparatus as shown comprises a housing or enclosure 51 having at least one light transmissive wall 52 and enclosing side-by-side photoanodes 54 and photocathodes 53. Housing 51 includes an electrolyte inlet opening 57 and oxygen and hydrogen outlets 55 and 56, respectively. Photoanode 54 and photocathode 53 are separated by an electrode separator 58. In operation, hydrogen and oxygen are formed at the surfaces of the photoelectrodes facing the at least one light transmissive wall 52 and are exhausted through oxygen and hydrogen outlets 55 and 56, respectively. It will be apparent that, because there is no electrolyte present in the space between light transmissive wall 52 and the photoelectrodes 53, 54, the hydrogen and oxygen gases generated at the photoelectrode surfaces are not impeded in leaving the housing.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

We claim:

1. An electrode for electrochemical splitting of water comprising:
    a light sensitive catalytic material layer;
    a polymer electrolyte membrane layer;
    a metallic substrate layer disposed there between adjacent said polymer electrolyte membrane layer; and
    at least one photovoltaic device connected in series to said light sensitive catalytic material layer and disposed between said light sensitive catalytic material layer and said metallic substrate layer, each of said light sensitive catalytic material layer, said polymer electrolyte membrane layer, said metallic substrate layer and said at least one photovoltaic device being water permeable.

2. An electrode in accordance with claim 1, wherein at least two said photovoltaic devices connected in series are disposed between said light sensitive catalytic material layer and said metallic substrate layer.

3. An electrode in accordance with claim 1, wherein said light sensitive catalyst material layer comprises an n-type semiconductor.

4. An electrode in accordance with claim 1, wherein said light sensitive catalyst material layer comprises a p-type semiconductor.

5. An electrode in accordance with claim 1, wherein said at least one photovoltaic device is a p-i-n device.

6. An electrode in accordance with claim 1, wherein said polymer electrolyte membrane layer is a proton exchange membrane.

7. An electrode in accordance with claim 1, wherein said polymer electrolyte membrane layer comprises a material selected from the group consisting of polyimide and perfluorosulfonate ionomers.

8. An electrode in accordance with claim 1, wherein said light sensitive catalytic material layer comprises a wide band gap semiconductor.

9. An electrode in accordance with claim 8, wherein said wide band gap semiconductor comprises a material selected from the group consisting of $TiO_2$, carbon black, perfluorosulfonate ionomer emulsion binder, an electrically conductive polymer, an electron conductive polymer, a proton conductive polymer and combinations thereof.

10. An electrode in accordance with claim 1, wherein said light sensitive catalytic material layer comprises a catalyst selected from the group consisting of Pt, Ni, Fe, Ti, light sensitive dyes and combinations thereof.

11. An apparatus comprising:
a housing having at least one light transmissive wall;
at least one water permeable photoelectrode disposed in said housing, said at least one water permeable photoelectrode comprising a first light sensitive catalytic material layer disposed at a distance from said at least one light transmissive wall and having a side facing said at least one light transmissive wall, a first polymer electrolyte membrane layer disposed on a side of said first light sensitive catalytic material layer opposite said side facing said at least one light transmissive wall, a first metallic substrate layer disposed between said first light sensitive catalytic material layer and said first polymer electrolyte membrane layer and adjacent said first polymer electrolyte membrane layer, and at least one photovoltaic device disposed between said first light sensitive catalytic material layer and said first metallic substrate layer and connected in series with said first light sensitive catalytic material layer;
an additional electrode of opposite polarity from said at least one water permeable photoelectrode disposed within said housing at a distance from said at least one water permeable photoelectrode; and
a water-based electrolyte disposed substantially only between said at least one water permeable photoelectrode and said additional electrode.

12. An apparatus in accordance with claim 11, wherein said additional electrode is a second water permeable photoelectrode having a second light sensitive catalytic material layer disposed at a distance from a second light transmissive wall.

13. An apparatus in accordance with claim 12, wherein at least one of said first light sensitive catalytic material layer and said second light sensitive catalytic material layer comprises a wide band gap semiconductor.

14. An apparatus in accordance with claim 12, wherein said first and second light sensitive catalytic material layers comprise a catalyst selected from the group consisting of Pt, Ni, Fe, Ti, light sensitive dyes and combinations thereof.

15. An apparatus in accordance with claim 11, wherein said at least one water permeable photoelectrode comprises at least two said photovoltaic devices connected in series.

16. An apparatus in accordance with claim 11, wherein said first light sensitive catalyst material layer comprises an n-type semiconductor.

17. An apparatus in accordance with claim 11, wherein said first light sensitive catalyst material layer comprises a p-type semiconductor.

18. An apparatus in accordance with claim 11, wherein said at least one photovoltaic device is a p-i-n device.

19. An apparatus in accordance with claim 11, wherein said first polymer electrolyte membrane layer is a proton exchange membrane.

20. An apparatus in accordance with claim 11, wherein said first polymer electrolyte membrane layer comprises a material selected from the group consisting of polyimide and perfluorosulfonate ionomers.

21. An apparatus in accordance with claim 11, wherein said first light sensitive catalytic material layer comprises a wide band gap semiconductor.

22. An apparatus in accordance with claim 21, wherein said wide band gap semiconductor comprises a material selected from the group consisting of $TiO_2$, carbon black, perfluorosulfonate ionomer emulsion binder, an electrically conductive polymer, an electron conductive polymer, a proton conductive polymer and combinations thereof.

23. An apparatus comprising:
a light transmissive enclosure having a hydrogen gas outlet opening and an oxygen gas outlet opening;
at least two water permeable photoelectrodes disposed at a distance from each other in said enclosure, each said water permeable photoelectrode comprising a light sensitive catalytic material layer disposed at a distance from a light transmissive wall of said light transmissive enclosure and facing said light transmissive wall, one of said light sensitive catalytic material layers in fluid communication with said hydrogen gas outlet opening and the other of said light sensitive catalytic material layers in fluid communication with said oxygen gas outlet opening, a polymer electrolyte membrane layer disposed on a side of said light sensitive catalytic material layer facing away from said light transmissive wall, a metallic substrate layer disposed between said light sensitive catalytic material layer and said polymer electrolyte membrane layer and adjacent said polymer electrolyte membrane layer, and at least one photovoltaic device disposed between said light sensitive catalytic material layer and said metallic substrate layer and connected in series with said light sensitive catalytic material layer; and
a water-based electrolyte disposed within said light transmissive enclosure substantially only on a side of said at least two water permeable photoelectrodes facing away from said light transmissive wall.

24. An apparatus in accordance with claim 23, wherein said light sensitive catalytic material layer of each said water permeable photoelectrode is facing a same said light transmissive wall of said light transmissive enclosure.

25. An apparatus in accordance with claim 24, wherein each said water permeable photoelectrodes comprises at least two said photovoltaic devices connected in series.

26. An apparatus in accordance with claim 24, wherein one of said light sensitive catalyst material layers comprises an n-type semiconductor and the other of said light sensitive catalyst material layers comprises a p-type semiconductor.

27. An apparatus in accordance with claim 24, wherein at least one of said light sensitive catalytic material layers comprises a wide band gap semiconductor.

28. An apparatus in accordance with claim 27, wherein said wide band gap semiconductor comprises a material selected from the group consisting of $TiO_2$, carbon black, perfluorosulfonate ionomer emulsion binder, an electrically conductive polymer, an electron conductive polymer, a proton conductive polymer and combinations thereof.

* * * * *